United States Patent [19]

Carlson et al.

[11] 4,341,594
[45] Jul. 27, 1982

[54] METHOD OF RESTORING SEMICONDUCTOR DEVICE PERFORMANCE

[75] Inventors: Richard O. Carlson; Alexander J. Yerman, both of Scotia, N.Y.

[73] Assignee: General Electric Company, Schenectady, N.Y.

[21] Appl. No.: 238,726

[22] Filed: Feb. 27, 1981

[51] Int. Cl.³ ............................ C23F 1/00; B44C 1/22; C03C 15/00; C03C 25/06
[52] U.S. Cl. .................................. 156/643; 156/646; 156/651; 156/656; 204/192 E
[58] Field of Search ....................... 134/1, 31; 156/643, 156/646, 650–652, 656; 252/79.1; 204/164, 192 E, 298

[56] References Cited

U.S. PATENT DOCUMENTS 3,806,365  4/1974  Jacob ................................. 134/1
4,062,720  12/1977  Alcorn et al. ...................... 156/643
4,180,432  12/1979  Clark ................................ 156/643

OTHER PUBLICATIONS

IBM Technical Disclosure Bulletin, vol. 21, No. 6, Nov. 1978, Plasma Removal of Residue Following Reactive Ion Etching of Aluminum and Aluminum Alloys by G. T. Chiu et al., p. 2315.
A. T. Bell, "An Introduction to Plasma Processing", Solid State Technology, Apr., 1978, pp. 89-94.

Primary Examiner—William A. Powell
Attorney, Agent, or Firm—Charles E. Bruzga; James C. Davis, Jr.; Marvin Snyder

[57] ABSTRACT

Contaminant metal residue on an organic passivation layer of a semiconductor device is removed by plasma etching thereof whereby the performance of the device is restored.

10 Claims, 2 Drawing Figures

METHOD OF RESTORING SEMICONDUCTOR DEVICE PERFORMANCE

BACKGROUND OF THE INVENTION

The present invention relates to a method of restoring semiconductor device performance, and more particularly to a method of removing contaminant metal residue from an organic passivation layer overlying a semiconductor device.

Semiconductor devices utilizing voltages in excess of about 100 volts are frequently provided with an organic passivation layer overlying various protective layers and electrodes thereof. Further manufacturing steps, such as that of connecting a solder "bump" to an electrode of such a semiconductor device, involve depositing different layers of metal onto an entire surface of the semiconductor device. Such entire surface comprises desired locations for such metal layers as well as the passivation layer on which the metal layers are not desired. It is known that the metal layers on the passivation layer serve as "contaminant" metal layers which should be removed. Accordingly, a procedure has been used which is aimed at removing such contaminant metal layers. This procedure comprises subjecting the contaminant metal layers to a wet chemical etchant which is acidic or alkaline. Such wet chemical etchant procedure frequently leaves contaminant metal residue from the contaminant metal layers on the passivation layer. Such contaminant metal residue has been found to be responsible for seriously degrading the performance of the semiconductor device.

There are several reasons why the wet chemical etchant procedure may leave contaminant metal residue on the passivation layer of a semiconductor device. First, this procedure involves many parameters which are difficult to reproduce accurately. Consequently, only sporadic success in removing the contaminant metal layers has been attained. Secondly, because the semiconductor device is immersed in a bath of liquid etchant during this procedure, metal which has been removed from the contaminant metal layers can travel in the liquid etchant and reattach to the passivation layer to contribute to contaminant metal residue. Additionally, a drawback of using a wet chemical etchant if it is used too forcefully in attempting to fully remove the contaminant metal layers (for example, by using an overly-strong chemical etchant, or by using a chemical etchant for an overly-extended period of time), poses risks of damage to the semiconductor device. These risks include severe etching or "attack" of exposed metal portions of the device and liftoff of the passivation layer. It would be desirable to provide a method of removing contaminant metal residue from a passivation layer of a semiconductor device which is reliably successful. It would also be desirable to provide a method for removing contaminant metal residue from a passivation layer of a semiconductor device which is not destructive of the semiconductor device.

OBJECTS OF THE INVENTION

Accordingly, it is an object of the present invention to provide a method of removing contaminant metal residue from a passivation layer of a semiconductor device which method is characterized as being reliably successful.

A further object of the present invention is to provide a method of removing contaminant metal residue from a passivation layer of a semiconductor device whih method is not destructive of the semiconductor device.

Further objects and advantages of the present invention will become apparent from a reading of the remainder of this specification in conjunction with the drawing figures.

SUMMARY OF THE INVENTION

In carrying out the present invention, there is provided a method of removing contaminant metal residue from an organic passivation layer of a semiconductor device. The method comprises plasma etching the contaminant metal residue with an etchant gas at sufficient electric field power and for a sufficient time to remove the contaminant metal residue.

BRIEF DESCRIPTION OF THE DRAWING FIGURES

FIG. 1 is a cross-sectional view of a vertical fragment of a semiconductor device illustrating contaminant metal residue (greatly enlarged) disposed on a passivation layer thereof; and FIG. 2 is a graph of collector current versus collector-to-emitter voltage for a power Darlington transistor illustrating degradation in the performance characteristic thereof due to the presence of contaminant metal residue.

DETAILED DESCRIPTION

Figure 1:
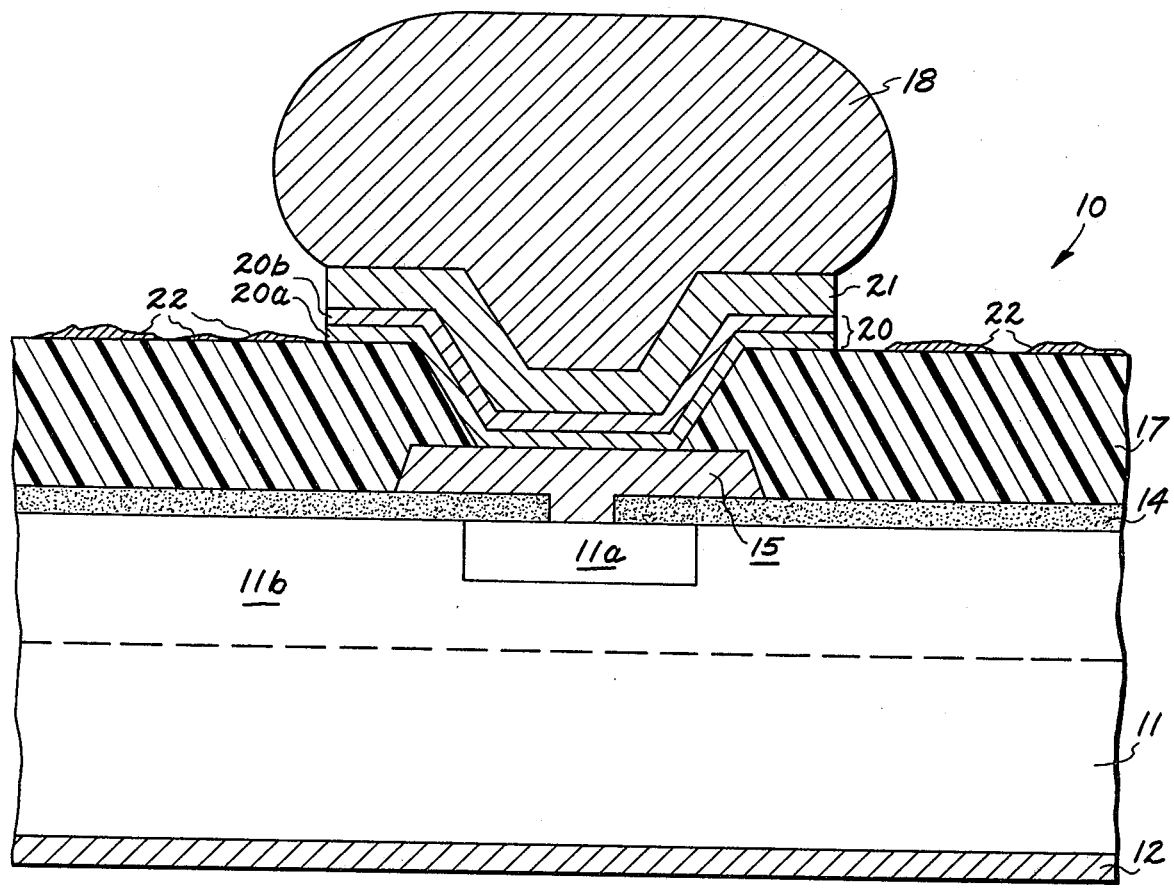

There is shown in FIG. 1 a portion of a semiconductor device 10 comprising a typical power Darlington transistor. The device 10 is provided with a solder "dump" 18 which is useful for providing a high thermal and electrical conductivity connection to external circuitry. The device 10 includes a silicon substrate 11 having a diffused emitter region area 11a in a base region area 11b of opposite doping type. A metallic backing layer 12 underlies the substrate 11 and a thermal oxide layer 14 overlies the substrate 11. An aluminum bonding pad 15 makes contact with the area11a through a channel in the thermal oxide layer 14. A passivation layer 17 overlies the thermal oxide layer 14 and portions of the aluminum bonding pad 15, except for an area thereon which is desired to be electrically connected to the solder bump 18. The passivation layer 17 is formed of an organic dielectric material resistant to temperatures involved in the fabrication of the device 10. A suitable organic dielectric material capable of withstanding the temperatures involved in fabricating a power Darlington transistor 10 with a solder bump 18 (which typically reach 450° C.) comprises a polymer such as polyimide or a polyimide-siloxane copolymer.

In a typical procedure for implementing the solder bump 18, once the passivation layer 17 has been provided, there is deposited over the entire upper surface of the passivation layer 17 and the then-exposed portions of the aluminum bonding pad 15, a series of metal layers 20, which are shown mostly etched away (by the prior art wet chemical etching procedure) to the right and left of the solder bump 18. These layers 20 typically comprise a sputtered metal layer 20a such as titanium or chromium which serves as a diffusion barrier and a sputtered metal layer 20b such as copper. A photoresist masking technique is used to mask the metal layer 20b except for the area where a solderable layer 21 is desired. This solderable layer 21 typically comprises copper and is applied by electroplating onto the unmasked area of the layer 20b. The solder bump 18 is provided by electroplating lead and tin onto the solderable layer 21, such lead and tin not adhering to the masked area of the metal layer 20b. The photoresist mask is then stripped, leaving the series of metal layers 20. These layers 20, except where desired (that is, beneath the solder bump 18), comprise "contaminant" metal layers. It is known to be desirable to remove these contaminant metal layers to provide proper performance of the device 10. The prior art process of removing such contaminant metal layers with a wet chemical etching procedure is then suitably used. However, as discussed above, the prior art process typically leaves contaminant metal residue on the passivation layer 17, indicated by the numeral 22 and shown greatly enlarged.

Figure 2:
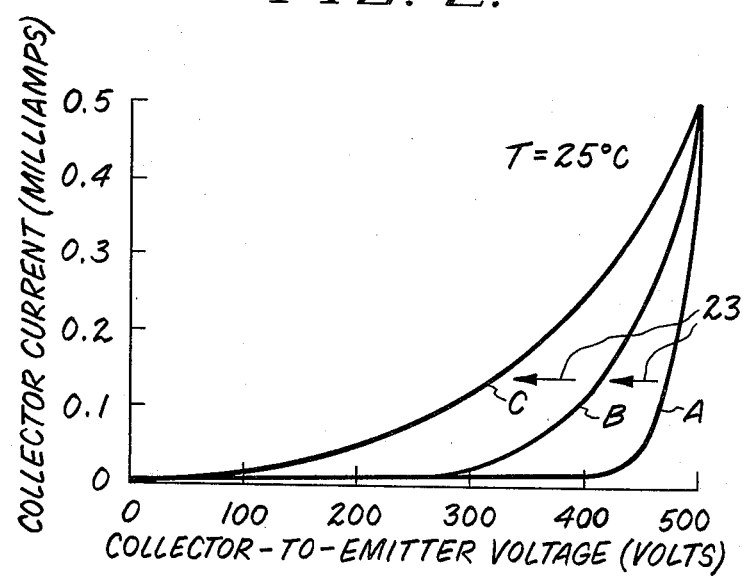

The presence of the contaminant metal residue 22 on the passivation layer 17 is responsible for degrading the performance of the semiconductor device 10. Therefore, the performance of the device 10 is advantageously ascertained to determine whether or not to employ the present inventive method. The performance of the device 10 can be explained with reference to FIG. 2. This figure shows a graph of collector current versus collector-to-emitter voltage at 25° Centigrade for a semiconductor device 10 comprising a typical power Darlington transistor, the base of which is "open". Curve A represents a typical desired performance characteristic for the device 10. In particular, curve A indicates a low collector "leakage" current up to a collector-to-emitter voltage of about 400 volts. Above the voltage, the collector current rather abruptly increases due to "avalanching" within the device 10. Accordingly, the device 10 would normally be operated with a voltage up to 400 volts. Curves B and C represent typical, progressively degraded performance characteristics relative to curve A. In particular, these curves show leakage currents which are excessive near 400 and 300 volts, respectively. Such an excessive leakage current generates heat in a device 10 which, in turn, results in still higher leakage current. This cycle can result in a "thermal runaway" condition of the device 10 and destruction thereof.

With contaminant metal residue 22 on the passivation layer 17, the device 10 may have a performance characteristic as represented by curve B or C. However, it is possible that the device 10 may initially have a performance characteristic, represented by curve A which characteristic then, within several seconds to several minutes will "migrate" in the direction of the arrows 23 to curve B or, still further, to curve C.

A performance characteristic for a device 10 which initially is represented by curve B or C, or which migrates from curve A to curve B or C as discussed above, is indicative of the presence of contaminant metal residue 22 on the passivation layer 17. Once it has been determined that contaminant metal residue 22 is thus present, the present invention provides a method for removing this residue 22, and thereby restoring the performance characteristic back to curve A. This method comprises plasma etching of the residue 22. Plasma etching is a "dry" technique in contrast with the prior art wet chemical etching technique. Plasma etching involves immersing a "target" surface to be etched in a stream of energetic, molecular-sized particles, generated by an electric field. Particles of the target surface are selectively volatized and are carried away in the stream of molecular-sized particles. As such, the technique of plasma etching, used subsequent to the prior art wet chemical etchant technique, avoids various drawbacks of solely using the wet chemical etching technique in attempting to fully remove the contaminant metal layers 20. These include haphazard reattachment of contaminant metal residue 22 on the passivation layer 17 and unintended etching or "attacking" of the wrong portions of the device 10 (if the wet chemical etchant is used too forcefully in attempting to fully remove the contaminant metal layers 20).

The technique of plasma etching is implemented with a known device termed a plasma etch reactor having a chamber in which subject material to be etched is placed. The chamber of a plasma etch reactor is provided with an etchant gas under the influence of an electric field which ionizes molecular fragments of the gas to highly energetic states whereby they interact with exposed surfaces of a subject material. In this way these surfaces become etched. A given etchant gas produces different etching rates depending on the composition of the subject material to be etched. Different etchant gases produce different etching rates for a given subject material. The power at which the electric field is generated can be varied to vary the etching rate. In addition, the size of a plasma etch reactor chamber and the size of subject material to be etched have bearing on the etching rate. Once an etching rate has been determined according to the foregoing factors, the time of etching determines the extent of removal of material from a subject material. The following example of an application of the plasma etching technique, according to the present invention, is therefore highly particularized. A three-inch wafer comprising power Darlington transistors indicated performance characteristics represented by curve C. A protective wax was temporarily coated over the metallic backing layer 12 of the wafer to prevent plasma etching thereof. The wafer was loaded into the etching chamber of an LFE PDE/PDS-301 plasma etch reactor. The etching chamber was provided with PDE-100 etchant gas (supplied by LFE) consisting of 91.5% $CF_4$ with 8.5% $O_2$. With the electric field power of the PDE/PDS-301 plasma etch reactor set at 300 watts, the wafer of transistors was etched for about 4 minutes. The performance characteristics of the transistors were then found to be restored to the performance of the characteristic represented by curve A.

In regard to a suitable period of time of etching, if the performance characteristic of a device 10 is not restored after etching for a first period of time, additional etching should be carried out in an iterative manner until the performance characteristic is restored. Further details of the technique of plasma etching are discussed, for example, in A. T. Bell, "An Introduction to Plasma Processing", Solid State Technology, Vol. 21, No. 4, pages 89-94 (April 1978), incorporated herein by reference.

While the invention has been described with respect to a specific embodiment, modifications thereof will occur to those skilled in the art. For example, various parameters of the plasma etching technique such as etchant gas composition, electric field power, and time of etching, can be varied and still achieve the inventive result. Further, semiconductor devices 10 other than power Darlington transistors can benifit from the present invention, although these transistors are particularly benefitted from the invention. This is due to the fact that the high-power, high-voltage (that is, over about 100 volts), and high-gain performance characteristics of a power Darlington transistor are seriously degraded by the presence of contaminant metal residue 22 on a passivation layer 17 thereof. By way of example, the following semiconductor devices 10, especially where utilizing a voltage in excess of about 100 volts, can benefit from the present invention: a diode, a bipolar transistor, a MOSFET and a silicon-controlled rectifier. These and all such modifications of the invention are deemed to fall within the true spirit and scope of the appended claims.

What we claim as our invention and desire to have secured by Letters Patent of the United States is:

1. A method of removing contaminant metal layers from an organic passivation layer of a semiconductor device, comprising wet chemical etching of said layers followed by plasma etching of metal residue of said contaminant metal layers with an etchant gas at sufficient electric field power and for a sufficient time to remove said metal residue.

2. The method of claim 1 wherein said organic passivation layer comprises a polymeric layer.

3. The method of claim 2 wherein said polymeric layer comprises a polyimide.

4. The method of claim 2 wherein said polymeric layer comprises a polyimide-siloxane copolymer.

5. The method of claim 1, 2, 3 or 4 wherein said semiconductor device utilizes a voltage in excess of about 100 volts.

6. The method of claim 5 wherein said semiconductor device comprises one of the group consisting of a power Darlington transistor, a diode, a bipolar transistor, a MOSFET, and a silicon-controlled rectifier.

7. The method of claim 1, 2, 3 or 4 wherein said semiconductor device comprises a power Darlington transistor.

8. The method of claim 5 wherein said etchant gas comprises $CF_4$ and $O_2$ in about a ten-to-one ratio.

9. The method of claim 8 wherein said etching continues for a duration of about 4 minutes at an electric field power of about 300 watts.

10. The method of claim 7 wherein said contaminant metal layers comprises contaminant metal layers of a solder bumping process.

* * * * *